United States Patent [19]

Tihanyi

[11] Patent Number: 5,352,932
[45] Date of Patent: Oct. 4, 1994

[54] TRIGGER CIRCUIT FOR A POWER FET WITH A LOAD ON THE SOURCE SIDE

[75] Inventor: Jenoe Tihanyi, Munich, Fed. Rep. of Germany

[73] Assignee: Siemens Aktiengesellschaft, Munich, Fed. Rep. of Germany

[21] Appl. No.: 73,095

[22] Filed: Jun. 7, 1993

[30] Foreign Application Priority Data

Jun. 5, 1992 [EP] European Pat. Off. ........ 92109582.4

[51] Int. Cl.$^5$ .................. H03K 19/094; H03K 17/687
[52] U.S. Cl. ..................................... 307/248; 307/270; 307/574
[58] Field of Search ............... 307/248, 570, 571, 576, 307/578, 255, 256, 270, 285, 546, 574

[56] References Cited

U.S. PATENT DOCUMENTS

| | | | |
|---|---|---|---|
| 4,356,416 | 10/1982 | Weischedel | 307/270 |
| 4,459,498 | 7/1984 | Stengl et al. | 307/270 |
| 4,500,801 | 2/1985 | Janutka | 307/570 |
| 4,677,325 | 6/1987 | Einzinger et al. | 307/576 |
| 4,716,309 | 12/1987 | Stroppiana | 307/248 |
| 4,719,531 | 1/1988 | Okado et al. | |
| 4,737,667 | 4/1988 | Tihanyi | 307/248 |
| 4,816,699 | 3/1989 | Mori et al. | 307/546 |
| 4,859,875 | 8/1989 | Tihanyi et al. | 307/570 |
| 4,928,053 | 5/1990 | Sicard et al. | 307/270 |
| 4,952,827 | 8/1990 | Leipold et al. | 307/270 |

FOREIGN PATENT DOCUMENTS 236967 9/1987 European Pat. Off. .

OTHER PUBLICATIONS

IBM Technical Disclosure Bulletin, vol. 26, No. 6 Nov. 1983.
BiDirectional Bipolar Electronic Switch, M. M. Bhansali, C. Munoz-Bustamante, and W. N. Zalph.

*Primary Examiner*—Timothy P. Callahan
*Assistant Examiner*—T. T. Lam
*Attorney, Agent, or Firm*—Herbert L. Lerner; Laurence A. Greenberg

[57] ABSTRACT

A first power FET has a source terminal, a gate terminal and a drain terminal and a load is connected in series with the source terminal of the power FET. A circuit configuration for triggering the first power FET includes a first input terminal. A first diode and a capacitor are connected between the first input terminal and the gate terminal of the first power FET. A second FET of the opposite channel type from that of the first power FET has a gate terminal and has drain and source terminals defining a drain-to-source path. A second diode is connected between the first diode and the capacitor and is connected through the drain-to-source path of the second FET to the drain terminal of the power FET. A resistor is connected between the gate and source terminals of the second FET. A controllable switch is connected to the gate terminal of the second FET. A second input terminal is connected to the controllable switch for receiving a voltage being lower than a supply voltage. A third depletion FET has a gate terminal connected to the controllable switch and has drain and source terminals defining a drain-to-source path connected between the gate terminal and the source terminal of the first power FET for discharging a gate-to-source capacitance of the first power FET.

9 Claims, 1 Drawing Sheet

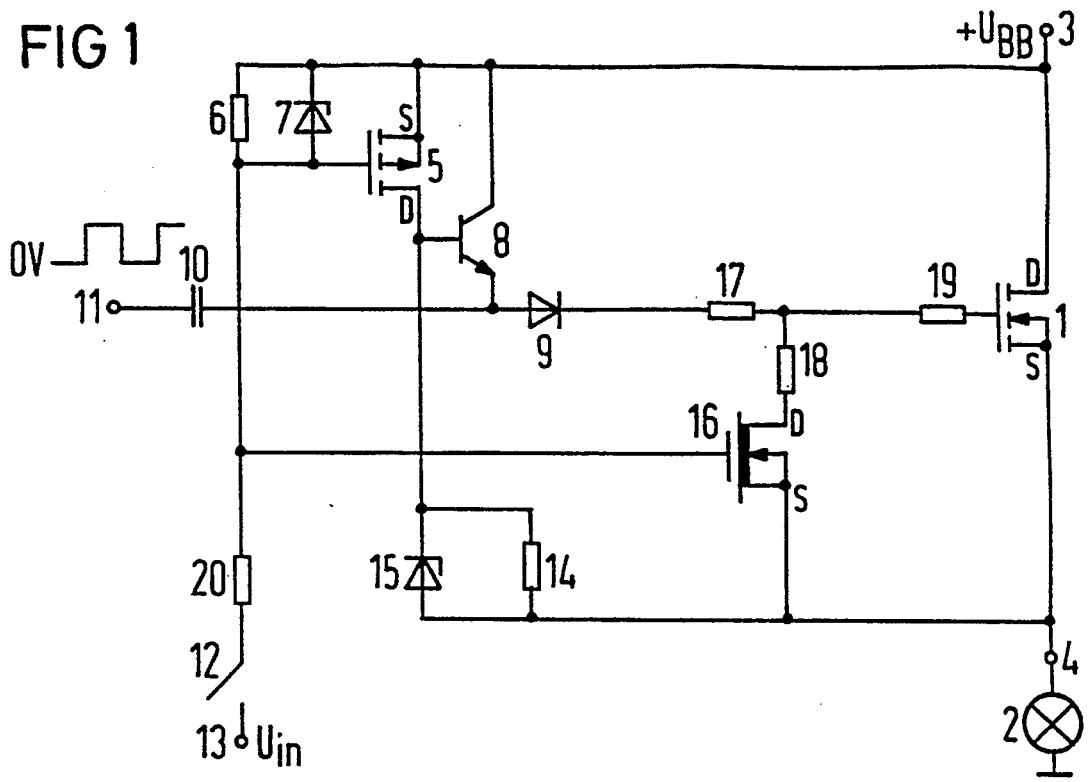
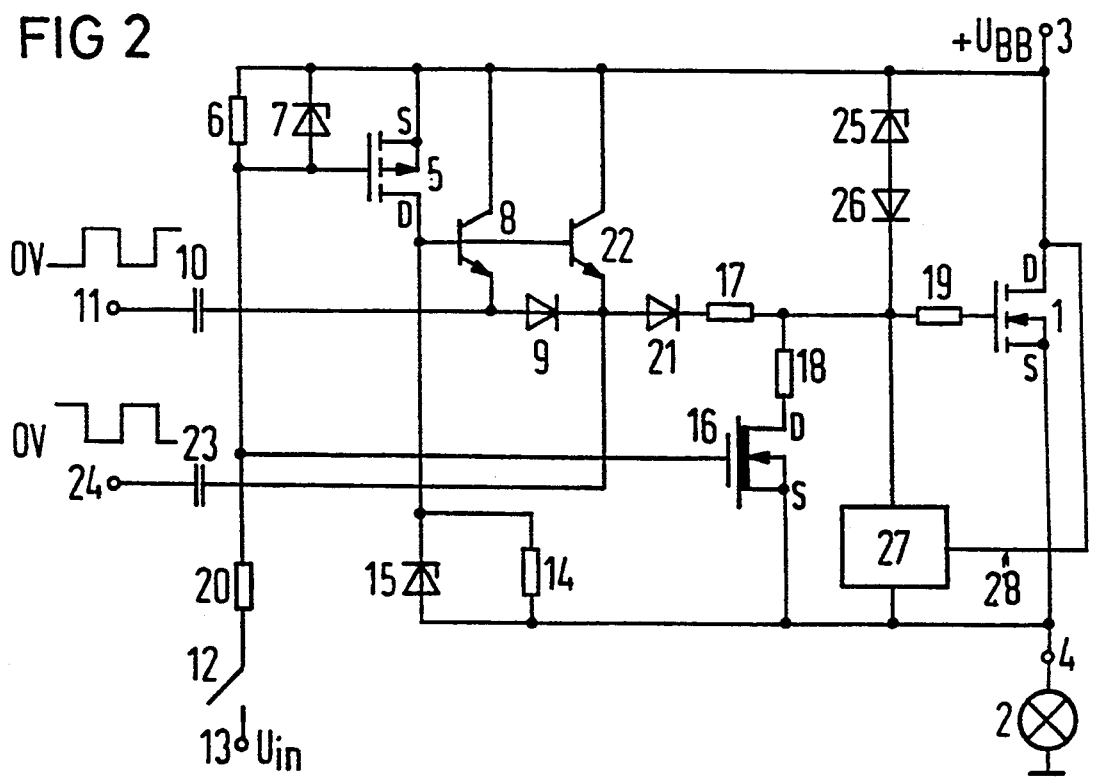

TRIGGER CIRCUIT FOR A POWER FET WITH A LOAD ON THE SOURCE SIDE

BACKGROUND OF THE INVENTION

Field of the Invention

The invention relates to a circuit configuration for triggering a power FET, with which a load is connected in series on the source side, having the following characteristics:

a) the gate electrode of the power FET is connected to a first input terminal through a first diode and a capacitor,
b) a second diode is connected between the first diode and the capacitor and is connected through the drain-to-source path of a second FET with the drain terminal of the power FET,
c) the second FET is of the opposite channel type from that of the power FET,
d) a resistor is connected between the gate and source terminals of the second FET,
e) the gate terminal of the second FET is connected to a controllable switch, and
f) the gate-to-source capacitance of the power FET can be discharged through the drain-to-source path of a third FET.

SUMMARY OF THE INVENTION

Such a circuit configuration has been described in Published European Application No. 0 236 967 A1, corresponding to U.S. Pat. No. 4,737,667, for instance. That circuit works according to the principle of the known voltage doubler circuit. As a result it is possible to make a power FET fully conducting with a load on its source side, even if the voltage at the control input is lower than the drain voltage. In the circuit described, the drain terminal of the second FET and the source terminal of the third FET are connected to ground. The load is also at ground potential. In a complex configuration, such as in a motor vehicle, considerable differences can arise between the ground potential of the trigger circuit to which the aforementioned circuit configuration belongs and the ground potential of the load.

The functional capability of the circuit configuration described above is therefore not always assured during operation.

It is accordingly an object of the invention to provide a trigger circuit for a power FET with a load on the source side, which overcomes the hereinafore-mentioned disadvantages of the heretofore-known devices of this general type and which does so in such a way that its functional capability is assured even if the aforementioned ground potentials differ from one another.

With the foregoing and other objects in view there is provided, in accordance with the invention, in a circuit including a first power FET having a source terminal, a gate terminal and a drain terminal, and a load connected in series with the source terminal of the power FET, a circuit configuration for triggering the first power FET, comprising a first input terminal; a first diode and a capacitor connected between the first input terminal and the gate terminal of the first power FET; a second FET being of the opposite channel type from that of the first power FET, having a gate terminal and having drain and source terminals defining a drain-to-source path; a second diode being connected between the first diode and the capacitor and being connected through the drain-to-source path of the second FET to the drain terminal of the power FET; a resistor connected between the gate and source terminals of the second FET; a controllable switch connected to the gate terminal of the second FET; a second input terminal connected to the controllable switch for receiving a voltage being lower than a supply voltage; and a third depletion FET having a gate terminal connected to the controllable switch and having drain and source terminals defining a drain-to-source path connected between the gate terminal and the source terminal of the first power FET for discharging a gate-to-source capacitance of the first power FET.

In accordance with another feature of the invention, there is provided a Zener diode connected parallel to the resistor.

In accordance with a further feature of the invention, there is provided a bipolar transistor having a collector terminal and having base and emitter terminals defining a base-to-emitter path; the second diode being formed by the base-to-emitter path of the bipolar transistor; the base terminal of the bipolar transistor being connected to the drain terminal of the second FET; a resistor connected between the base terminal of the bipolar transistor and the source terminal of the power FET; the emitter terminal of the bipolar transistor being connected to the first diode; and the collector terminal of the bipolar transistor being connected to the source terminal of the second FET.

In accordance with an added feature of the invention, there is provided a Zener diode connected parallel to the resistor.

In accordance with an additional feature of the invention, there is provided a third diode being connected to the first diode at a node and being connected to the gate terminal of the first power FET; another bipolar transistor having base, collector and emitter terminals, the base and collector terminals of the other bipolar transistor being respectively connected to the drain and source terminals of the second FET, and the emitter terminal of the other bipolar transistor being connected to the node between the first and third diodes; a third input terminal; another capacitor connected between the emitter terminal of the bipolar transistor and the third input terminal; and the first and third input terminals receiving input signals being phase-offset from one another by 180°.

In accordance with yet another feature of the invention, there is provided an anti-series circuit of a diode and a Zener diode being connected between the gate terminal and the drain terminal of the first power FET.

In accordance with yet a further feature of the invention, there are provided means connected between the gate terminal and the source terminal of the first power FET for limiting a gate-to-source voltage of the first power FET as a function of a drain voltage of the first power FET.

In accordance with a concomitant feature of the invention, the controllable switch is an FET.

Other features which are considered as characteristic for the invention are set forth in the appended claims.

Although the invention is illustrated and described herein as embodied in a trigger circuit for a power FET with a load on the source side, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a basic schematic circuit diagram of the invention; and

FIG. 2 is a further schematic and block circuit diagram based on the circuit of FIG. 1, with a plurality of further features that are functionally independent of one another.

DESCRIPTION OF THE PREFERRED EMBODIMENT

Referring now to the figures of the drawing in detail and first, particularly, to FIG. 1 thereof, there is seen a circuit configuration that includes a first power FET 1, having a drain terminal D which is connected through a terminal 3 to a supply voltage $+U_{BB}$. The first power FET 1 has a source terminal S that is connected through a terminal 4 to a load 2. This load is connected to ground (load ground) on one side. A series circuit including a second FET 5 and a resistor 14 is connected between the drain terminal and the source terminal of the first power FET 1. The second FET 5 is of the opposite channel type from the first power FET. The second FET 5 has a source terminal that is connected to the drain terminal of the first power FET 1, and a drain terminal that is connected to the resistor 14. A resistor 6 is connected between a gate terminal of the second FET 5 and its source terminal.

A gate terminal of the first power FET 1 is connected through resistors 17, 19 and a first diode 9 to one terminal of a capacitor 10. Another terminal of the capacitor 10 is connected to a first input terminal 11. An emitter terminal of an npn bipolar transistor 8 is connected to a connecting point between the capacitor 10 and the first diode 9. A base terminal of the npn bipolar transistor 8 is connected to the drain terminal of the second FET 5 and a collector terminal thereof is connected to the source terminal of the second FET 5. A drain-to-source path of a third FET 16, which is constructed as a depletion FET, and a resistor 18, are connected between the gate terminal and the source terminal of the first power FET 1. The source terminal of the third FET 16 is connected to the source terminal of the first power FET 1. A gate terminal of the third FET 16 is connected on one hand through a resistor 20 and a controllable switch 12 to a second input terminal 13, and on the other hand to the gate terminal of the second FET 5.

If the controllable switch 12 is turned on, then an input voltage $U_{in}$ that is lower than the supply voltage $+U_{BB}$ is applied to the gate terminal of the FET 5.

This causes a current to flow from the terminal 3 through the resistor 6, the resistor 20, and the controllable switch 12 to the terminal 13. The resistors 6 and 20 are dimensioned in such a way that the FET 5 is made conducting and the depletion FET 16 is blocked. Thus a current flows through the drain-to-source path of the FET 5, on one hand through the resistor 14 and on the other into the base terminal of the bipolar transistor 8. This makes the bipolar transistor conducting, and a current flows through the diode 9 and the resistors 17 and 19 to the gate terminal of the first power FET 1 and charges the gate-to-source capacitance of the power FET. The power FET then begins to conduct.

Simultaneously with the gate-to-source capacitance of the first power FET 1, the capacitor 10 is also charged through the collector-to-emitter path of the bipolar transistor 8. If a pulse train is then fed into the input terminal 11, the potential at the connecting point between the capacitor 10 and the diode 9 is raised, and the gate-to-source capacitance of the power FET is further charged. Discharging of the capacitor 10 through the resistor 14 and the load 2 to ground is prevented through the base-to-emitter path of the bipolar transistor 8, which path is biased in the blocking direction. The base-to-emitter path of the bipolar transistor corresponds to a second diode of the known circuit. Naturally, for purposes of simplification, a simple diode could also be used instead of the bipolar transistor 8 in the circuit of FIG. 1. The diode would have an anode terminal connected to the drain terminal of the FET 5 and a cathode terminal connected to the anode terminal of the first diode 9.

In order to turn off the first power FET 1, the controllable switch 12 is opened. This causes the voltage at the gate terminal of the depletion FET 16 to rise and make this FET conducting. The FET 5 and the bipolar transistor 8 are simultaneously blocked. As a result, the gate-to-source capacitance of the first power FET 1 is discharged, and the transistor blocks. The resistors 17, 18 and 19 are dimensioned in such a way that the great majority of the current that continues to be fed into the first input drains out through the depletion FET 16, so that recharging of the gate-to-source capacitance of the first power FET 1 is prevented.

Zener diodes 7, 15 can each be connected parallel to one of the respective resistors 6, 14. The Zener diode 7 protects the gate-to-source capacitance of the FET 5 against overvoltage. The Zener diode 15 prevents the bipolar transistor 8 from being overdriven.

The circuit described above has the advantage of protecting the first power FET 1 in the even of a short circuit of the load 2. In that case, the terminal 4 is connected to ground potential, and the base potential of the bipolar transistor 8 is limited to the Zener voltage of the Zener diode 15. At maximum, the aforementioned Zener voltage minus the on-state voltages of the base-to-emitter diode of the bipolar transistor 8 and of the diode 9 is then present at the gate terminal of the first power FET 1. Thus the maximum gate-to-source voltage of the first power FET 1 and therefore the maximum current in the event of a short circuit can be set by means of the selection of the Zener diode 15.

The circuit configuration of FIG. 2 differs from that of FIG. 1 in terms of a number of further features, each of which may be employed alone or in any arbitrary combination. Elements that are the same or function the same as those in FIG. 1 are provided with the same reference numerals.

In a first further feature, an anti-series circuit including a Zener diode 25 and a diode 26 may be connected between the drain terminal of the first power FET 1 and a connecting point between the resistors 17 and 19. A cathode of the Zener diode 25 is connected to the drain terminal of the first power FET 1. As a result, voltage peaks that can occur when an inductive load is turned off are diminished.

In a second further feature, means 27 for voltage limitation may be provided between the connecting point of the resistors 17 and 19 and the source terminal of the first power FET 1. These means are controlled by the drain voltage of the first power FET 1 through a control line 28 in such a way that when the drain-to-source voltage is rising, for instance as a result of a short circuit, the gate-to-source voltage of the power FET is reduced. A current limitation in the power FET can thus be attained. An example of voltage limiting means 27 seen in FIG. 2 is shown in U.S. Pat. No. 4719531, and incorporated herein by reference.

A further improvement may take the form of incorporating a third diode 21 between the first diode 9 and the resistor 17. An anode of the third diode 21 is connected to the cathode of the first diode 9. A connecting point of the two diodes is connected to a third input terminal 24 through a further capacitor 23.

If a pulse train that is phase-offset by 180° from the pulse train applied to the input 11 is applied to the terminal 24, then a voltage which is pumped up at the cathode terminal of the diode 9 is added to the voltage of the capacitor 23. A faster rise of the gate voltage of the first power FET 1 is thereby attained. Discharging of the capacitor 23 in intervals between loads is prevented through a base-to-emitter path of a bipolar transistor 22, having an emitter which is connected between the cathode of the diode 9 and the anode of the diode 21. The bipolar transistor 22 has collector and base terminals that are respectively connected to the collector and base terminals of the bipolar transistor 8. The bipolar transistor 22 is turned on simultaneously with the bipolar transistor 8 through the FET 5. The gate-to-source capacitance of the first power FET 1 is additionally charged through the collector-to-emitter path of the bipolar transistor 22, the diode 21 and the resistors 17 and 19.

The controllable switch 12 has been shown in the form of a mechanical switch in the drawings. However, it is suitably to use an electronic switch, such as a FET therefor.

The resistors used in the exemplary embodiments may also be current sources. In a known manner, they can be constructed as a depletion FET having source and gate terminals which are connected to one another.

I claim:

1. In a circuit including a first power FET having a source terminal, a gate terminal and a drain terminal connected to a power supply, and a load connected in series with the source terminal of the first power FET, a circuit configuration for triggering the first power FET, comprising:
   a) a first input terminal;
   b) a first diode and a capacitor connected between said first input terminal and the gate terminal of the first power FET;
   c) a second FET being of the opposite channel type from that of the first power FET, having a gate terminal and having drain and source terminals defining a drain-to-source path;
   d) a second diode being connected between said first diode and said capacitor and being connected through the drain-to-source path of said second FET to the drain terminal of the first power FET;
   e) a first resistor connected between the gate and source terminals of said second FET;
   f) a controllable switch connected to the gate terminal of said second FET;
   g) a third FET having drain and source terminals defining a drain-to-source path connected between the gate terminal and the source terminal of the first power FET for discharging a gate-to-source capacitance of the first power FET;
   h) said third FET being a depletion FET;
   i) said third FET having a gate terminal connected to said controllable switch; and
   j) a second input terminal connected to said controllable switch for receiving a voltage capable of blocking said third FET when said controllable switch is turned on.

2. The circuit configuration according to claim 1, including a Zener diode connected parallel to the first resistor.

3. The circuit configuration according to claim 1, including a bipolar transistor having a collector terminal and having base and emitter terminals defining a base-to-emitter path; said second diode being formed by the base-to-emitter path of said bipolar transistor; the base terminal of said bipolar transistor being connected to the drain terminal of said second FET; a second resistor connected between the base terminal of said bipolar transistor and the source terminal of the first power FET; the emitter terminal of said bipolar transistor being connected to said first diode; and the collector terminal of said bipolar transistor being connected to the source terminal of said second FET.

4. The circuit configuration according to claim 3, including a Zener diode connected parallel to the second resistor.

5. The circuit configuration according to claim 1, including:
   a) a third diode being connected to said first diode at a node and being connected to the gate terminal of the first power FET;
   b) a bipolar transistor having base, collector and emitter terminals, the base and collector terminals of said bipolar transistor being respectively connected to the drain and source terminals of said second FET, and the emitter terminal of said bipolar transistor being connected to the node between said first and third diodes;
   c) a third input terminal;
   d) another capacitor connected between the emitter terminal of said bipolar transistor and said third input terminal; and
   e) said first and third input terminals receiving input signals being phase-offset from one another by 180°.

6. The circuit configuration according to claim 3, including:
   a) a third diode being connected to said first diode at a node and being connected to the gate terminal of the first power FET;
   b) another bipolar transistor having base, collector and emitter terminals, the base and collector terminals of said other bipolar transistor being respectively connected to the drain and source terminals of said second FET, and the emitter terminal of said other bipolar transistor being connected to the node between said first and third diodes;
   c) a third input terminal;
   d) another capacitor connected between the emitter terminal of said bipolar transistor and said third input terminal; and
   e) said first and third input terminals receiving input signals being phase-offset from one another by 180°.

7. The circuit configuration according to claim 1, including an anti-series circuit of a diode and a Zener diode being connected between the gate terminal and the drain terminal of the first power FET.

8. The circuit configuration according to claim 1, including means connected between the gate terminal and the source terminal of the first power FET for limiting a gate-to-source voltage of the first power FET as a function of a drain voltage of the first power FET.

9. The circuit configuration according to claim 1, wherein said controllable switch is an FET.

* * * * *